United States Patent
Ogiso et al.

(10) Patent No.: US 10,599,043 B2
(45) Date of Patent: Mar. 24, 2020

(54) CRITICAL METHODOLOGY IN VACUUM CHAMBERS TO DETERMINE GAP AND LEVELING BETWEEN WAFER AND HARDWARE COMPONENTS

(71) Applicant: Applied Materials, Inc., Santa Clara, CA (US)

(72) Inventors: Hiroyuki Ogiso, Sunnyvale, CA (US); Jianhua Zhou, Campbell, CA (US); Zonghui Su, San Jose, CA (US); Juan Carlos Rocha-Alvarez, San Carlos, CA (US); Jeongmin Lee, Sunnyvale, CA (US); Karthik Thimmavajjula Narasimha, San Francisco, CA (US); Rick Gilbert, San Jose, CA (US); Sang Heon Park, Fremont, CA (US); Abdul Aziz Khaja, San Jose, CA (US); Vinay Prabhakar, Cupertino, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 314 days.

(21) Appl. No.: 15/675,101

(22) Filed: Aug. 11, 2017

(65) Prior Publication Data

US 2018/0046088 A1    Feb. 15, 2018

Related U.S. Application Data

(60) Provisional application No. 62/374,602, filed on Aug. 12, 2016.

(51) Int. Cl.
*H01L 21/26* (2006.01)
*H01L 21/66* (2006.01)
(Continued)

(52) U.S. Cl.
CPC .......... *G03F 7/70283* (2013.01); *C23C 16/52* (2013.01); *G03F 7/16* (2013.01);
(Continued)

(58) Field of Classification Search
CPC ... H01L 21/67253; G01Q 70/02; G01Q 70/06
See application file for complete search history.

(56) References Cited

U.S. PATENT DOCUMENTS 6,015,718 A * 1/2000 Rathbone ................ H01L 22/34
257/E21.53
7,018,855 B2 * 3/2006 Kota ................ H01L 21/67253
257/E21.525
(Continued)

FOREIGN PATENT DOCUMENTS

JP         5792786 B2     10/2015
KR       200303033 Y1     3/2003
(Continued)

OTHER PUBLICATIONS

International Search Report and Written Opinion dated Nov. 28, 2017 for Application No. PCT/US2017/042386.
Taiwanese Office Action (with attached English translation) for Application No. 106124696; dated Mar. 28, 2019; 5 total pages.

*Primary Examiner* — Bradley Smith
*Assistant Examiner* — David J Goodwin
(74) *Attorney, Agent, or Firm* — Patterson + Sheridan LLP

(57) ABSTRACT

Implementations described herein generally relate to methods for leveling a component above a substrate. In one implementation, a test substrate is placed on a substrate support inside of a processing chamber. A component, such as a mask, is located above the substrate. The component is lowered to a position so that the component and the substrate are in contact. The component is then lifted and the particle distribution on the test substrate is reviewed. Based on the (Continued)

particle distribution, the component may be adjusted. A new test substrate is placed on the substrate support inside of the processing chamber, and the component is lowered to a position so that the component and the new test substrate are in contact. The particle distribution on the new test substrate is reviewed. The process may be repeated until a uniform particle distribution is shown on a test substrate.

20 Claims, 4 Drawing Sheets

(51) Int. Cl.
  *G03F 7/20*    (2006.01)
  *G03F 7/16*    (2006.01)
  *H01L 21/02*    (2006.01)
  *H01L 21/683*    (2006.01)
  *C23C 16/52*    (2006.01)
  *H01L 21/12*    (2006.01)

(52) U.S. Cl.
  CPC .... *G03F 7/70058* (2013.01); *H01L 21/02299* (2013.01); *H01L 21/12* (2013.01); *H01L 21/6838* (2013.01); *H01L 22/20* (2013.01)

(56) References Cited

U.S. PATENT DOCUMENTS

| | | | | |
|---|---|---|---|---|
| 7,417,733 | B2* | 8/2008 | Wright | G01N 15/0205 |
| | | | | 257/E21.527 |
| 9,458,532 | B2* | 10/2016 | Sonoda | C23C 14/042 |
| 2009/0078888 | A1* | 3/2009 | Namba | B82Y 10/00 |
| | | | | 250/491.1 |
| 2011/0165329 | A1* | 7/2011 | Mirkin | G03F 7/0002 |
| | | | | 427/256 |
| 2011/0268883 | A1* | 11/2011 | Haaheim | B82Y 10/00 |
| | | | | 427/256 |
| 2012/0031873 | A1 | 2/2012 | Bai | |
| 2012/0183676 | A1 | 7/2012 | Sonoda et al. | |
| 2013/0302134 | A1 | 11/2013 | Park et al. | |
| 2014/0304861 | A1* | 10/2014 | Kim | G03F 7/0002 |
| | | | | 850/18 |
| 2017/0148654 | A1* | 5/2017 | Paul | G05B 19/041 |

FOREIGN PATENT DOCUMENTS

| | | |
|---|---|---|
| KR | 1020100026448 | 3/2010 |
| KR | 101326061 B1 | 11/2013 |

* cited by examiner

CRITICAL METHODOLOGY IN VACUUM CHAMBERS TO DETERMINE GAP AND LEVELING BETWEEN WAFER AND HARDWARE COMPONENTS

CROSS-REFERENCE TO RELATED APPLICATIONS

This application claims priority to U.S. Provisional Patent Application Ser. No. 62/374,602, filed on Aug. 12, 2016, which herein is incorporated by reference.

BACKGROUND

Field

Implementations described herein generally relate to methods for processing a semiconductor substrate. More particularly, implementations described herein relate to methods for leveling a component above a substrate and controlling a gap between the component and the substrate.

Description of the Related Art

In the field of integrated circuit and flat panel display fabrication, multiple deposition and etching processes are performed in sequence on a substrate among one or more process chambers to form various design structures. During the deposition or etching processes, a component, such as a mask or a showerhead, may be located above the substrate. Conventionally methods for leveling the component, i.e., ensuring the component and the substrate are parallel, are performed with a gap of at least 0.65 in. (650 mil) between the component and the substrate. In some processes, the component is located about 10 mil above the substrate during processing. Thus, the component may not be leveled with respect to the substrate as the component is lowered to a processing position. In addition, as the gap between the component and the substrate is getting smaller, the gap becomes more difficult to control.

Therefore, an improved method is needed to level the component and to control the gap between the component and the substrate.

SUMMARY

Implementations described herein generally relate to methods for processing a semiconductor substrate. More particularly, implementations described herein relate to methods for leveling a component above a substrate and controlling a gap between the component and the substrate. In one implementation, a method includes placing a test substrate onto a substrate support inside of a processing chamber, and a component is located above the test substrate. The method further includes lowering the component to a position so that the component and the test substrate are in contact, lifting the component from the test substrate, reviewing a particle distribution on the test substrate, and adjusting the component.

In another implementation, a method including placing a test substrate onto a substrate support inside of a processing chamber, and a mask is located above the test substrate. The method further includes lowering the mask to a position so that the mask and the test substrate are in contact, lifting the mask from the test substrate, reviewing a particle distribution on the test substrate, adjusting the mask, placing a new test substrate onto the substrate support inside of the processing chamber, lowering the mask to a position so that the mask and the test substrate are in contact, and reviewing a particle distribution on the new test substrate.

In another implementation, a method includes placing a test substrate onto a substrate support inside of a processing chamber, and a component is located above the test substrate. The method further includes lowering the component to a first position so that the component and the test substrate are in contact, lifting the component from the test substrate, reviewing a particle distribution on the test substrate, placing a first new test substrate onto the substrate support inside of the processing chamber, lowering the component to a second position that is higher than the first position, and reviewing a particle distribution on the first new test substrate.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
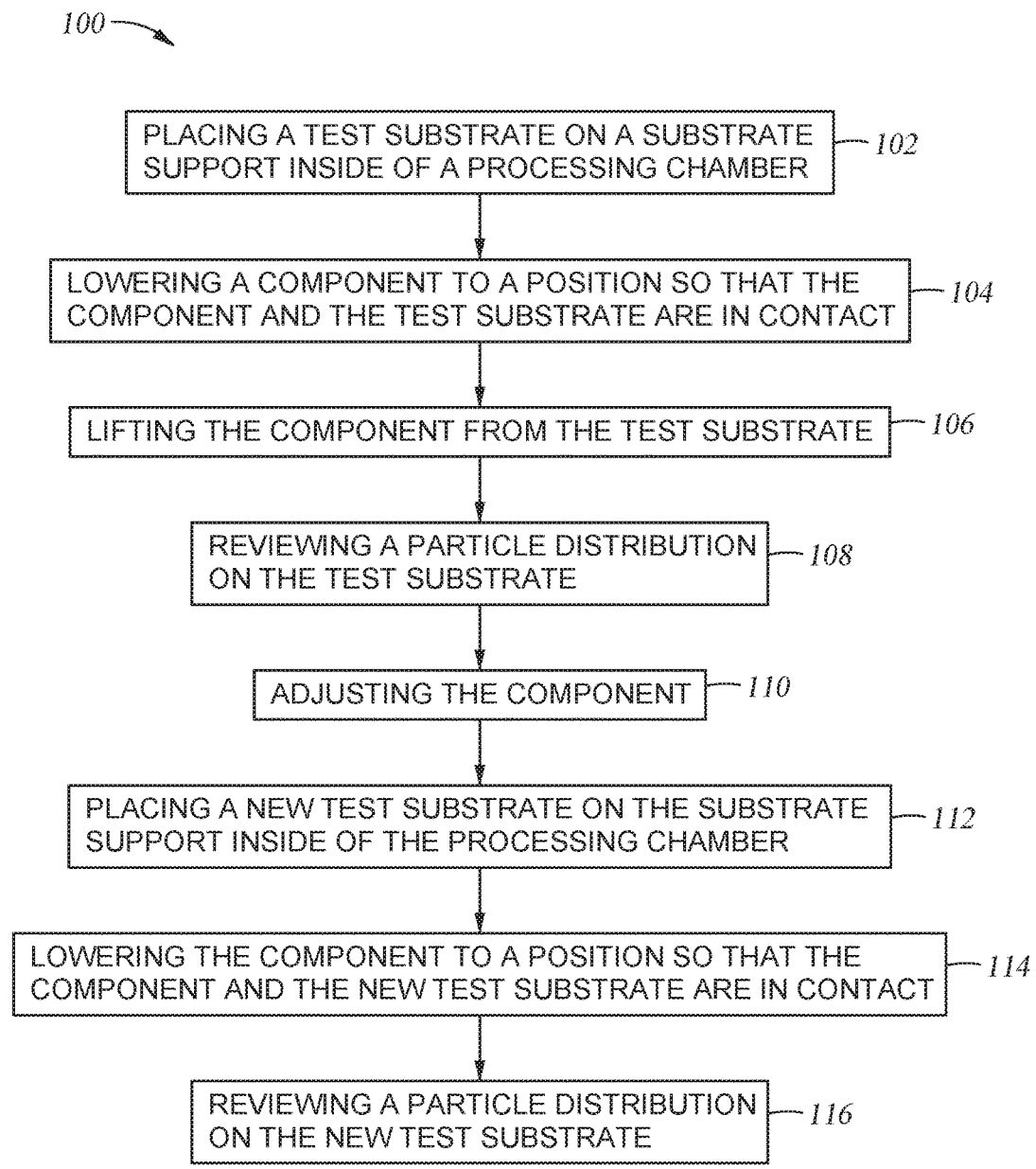
FIG. 1 illustrates operations of a method according to one implementation disclosed herein.

To facilitate understanding, identical reference numerals have been used, where possible, to designate identical elements that are common to the figures. It is contemplated that elements and features of one implementation may be beneficially incorporated in other implementation without further recitation.

DETAILED DESCRIPTION

Implementations described herein generally relate to methods for processing a semiconductor substrate. More particularly, implementations described herein relate to methods for leveling a component above a substrate and controlling a gap between the component and the substrate. In one implementation, a test substrate is placed on a substrate support inside of a processing chamber. A component, such as a mask, is located above the substrate. The component is lowered to a position so that the component and the substrate are in contact. The component is then lifted and the particle distribution on the test substrate is reviewed. Based on the particle distribution, the component may be adjusted. A new test substrate is placed on the substrate support inside of the processing chamber, and the component is lowered to a position so that the component and the new test substrate are in contact. The particle distribution on the new test substrate is reviewed. The process may be repeated until a uniform particle distribution is shown on the test substrate.

Figure 2A:
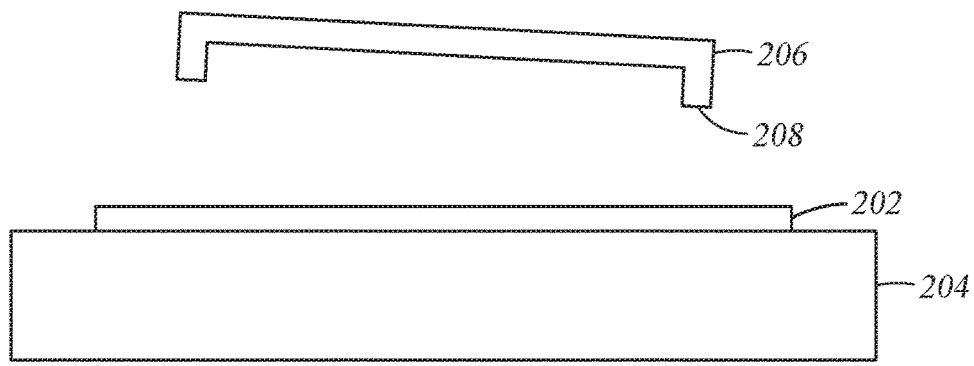
FIGS. 2A-2E illustrate operations of leveling a mask with respect to a substrate based on the method referred to in FIG. 1.

FIG. 1 illustrates operations of a method 100 according to one implementation disclosed herein. FIGS. 2A-2E correspond to the method 100 to illustrate operations of leveling a mask with respect to a substrate. At block 102, a test substrate 202 is placed on a substrate support 204 inside of a processing chamber, as shown in FIG. 2A. A component 206, such as a mask, is located above the test substrate 202 inside of the processing chamber. The test substrate 202 may be a particle substrate or mechanical grade substrate on which few particles are located on the surface facing the component 206. The component 206 may include an annular protrusion 208 extending toward the test substrate 202. The component 206 may be any suitable component located above a substrate and may include any suitable shape or pattern. In one implementation, the component 206 is a showerhead. In one implementation, the component 206 includes a surface facing the substrate 202, and the surface is substantially flat. The substrate support 204 may be any suitable substrate support, such as a vacuum chuck, an electrostatic chuck, or a heated pedestal.

Figure 2B:
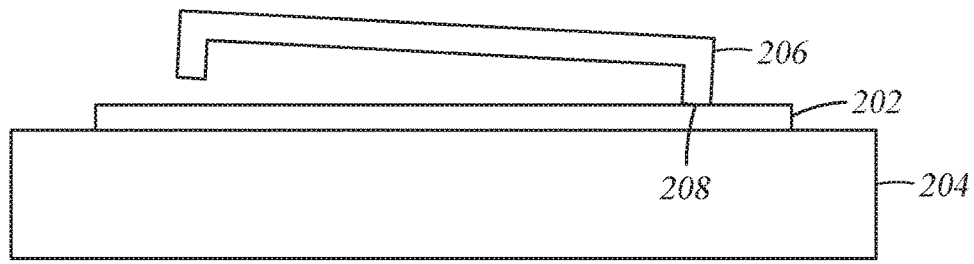
Figure 2C:
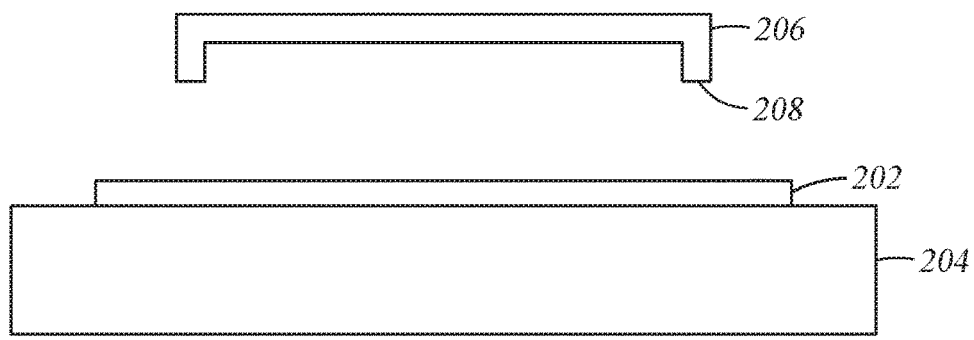

At block 104, the component 206 is lowered to a position so the component 206 and the test substrate 202 are in contact, as shown in FIG. 2B. In one implementation, the contact is determined by the friction or resistance sensed by the motor lowering/lifting the component 206. In the event that the component 206 is not substantially parallel to the test substrate 202, a portion of the component 206 (a portion of the annular protrusion 208) is in contact with the test substrate 202, while a remaining portion of the component 206 (a remaining portion of the annular protrusion 208) is spaced apart from the test substrate 202, as shown in FIG. 2B. At block 106, the component 206 is lifted from the test substrate 202, as shown in FIG. 2C. The test substrate 202 may be removed from the processing chamber and may be placed into a metrology tool. The particle distribution on the surface of the test substrate 202 is reviewed, as shown at block 108. The particle distribution may be obtained from the metrology tool. At the contact point between the component 206 and the test substrate 202, particles are generated and remain on the surface of the test substrate 202. If the distribution of particles on the surface of the test substrate 202 matches the surface profile of the component 206 and is substantially uniform, then the component 206 is leveled, i.e., substantially parallel to the test substrate 202. For example, the component 206 includes the annular protrusion 208, and particles on the surface of the test substrate 202 show an annular shape that matches the shape of the annular protrusion 208. In addition, the particles on the surface of the test substrate 202 are substantially uniform within the annular shape.

On the other hand, if the distribution of particles on the surface of the test substrate 202 does not match the surface profile of the component 206 and/or is not substantially uniform, then the component 206 is not level, i.e., not substantially parallel to the test substrate 202. For example, the component 206 includes the annular protrusion 208, and particles on the surface of the test substrate 202 do not show an annular shape that matches the shape of the annular protrusion 208. Alternatively, the particles are not substantially uniformly distributed within an annular shape. In this case, the component 206 is not leveled with respect to a production substrate during processing, and the tilted component 206 can cause the number of defects on a production substrate to increase.

In order to level the component 206 with respect to the test substrate 202, the component 206 is adjusted so the portion of the component 206 contacting the test substrate 202 is raised by a predetermined amount, as shown at block 110. The portion of the component 206 may be raised by any suitable method. In one implementation, the component 206 is secured to the processing chamber by a plurality of screws, and the portion of the component 206 may be raised by turning one or more corresponding screws of the plurality of screws. The predetermined amount may depend on the device that is utilized to raise the portion of the component 206. For example, a full turn of the screw may raise the corresponding portion of the component 206 by 1 mil.

Figure 2D:
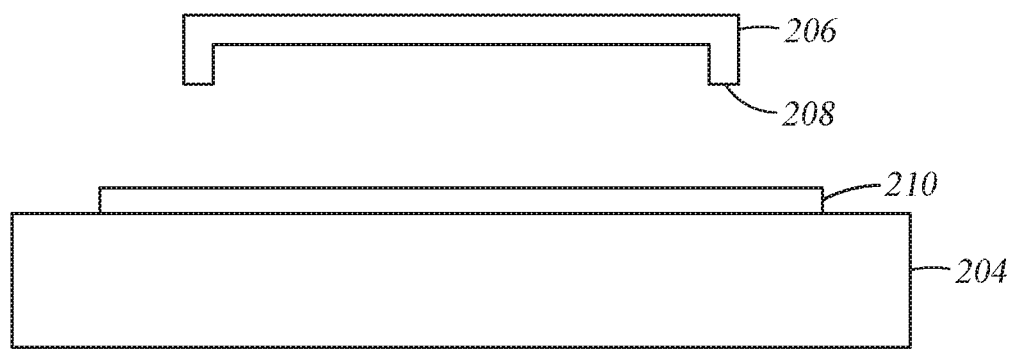
Figure 2E:
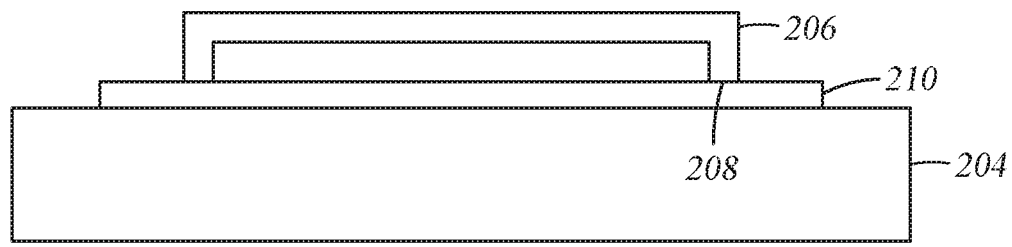

Next, at block 112, a new test substrate 210 is placed onto the substrate support 204 inside of the processing chamber, as shown in FIG. 2D. At block 114, the component 206 is lowered to a position so the component 206 and the new test substrate 210 are in contact, as shown in FIG. 2E. The component 206 is then lifted from the new test substrate 210, and the new test substrate 210 may be removed from the processing chamber and may be placed into a metrology tool. At block 116, the particle distribution on the surface of the new test substrate 210 is reviewed. If the distribution of particles on the surface of the new test substrate 210 matches the surface profile of the component 206 and is substantially uniform, then the component 206 is level with respect to the new test substrate 210. In other words, the component 206 is level with respect to a production substrate to be processed inside of the processing chamber. If the distribution of particles on the surface of the new test substrate 210 does not match the surface profile of the component 206 and/or is not substantially uniform, then operations shown at blocks 110, 112, 114, and 116 may be repeated until the distribution of particles on the surface of a test substrate matches the surface profile of the component 206 and is substantially uniform.

Figure 3:
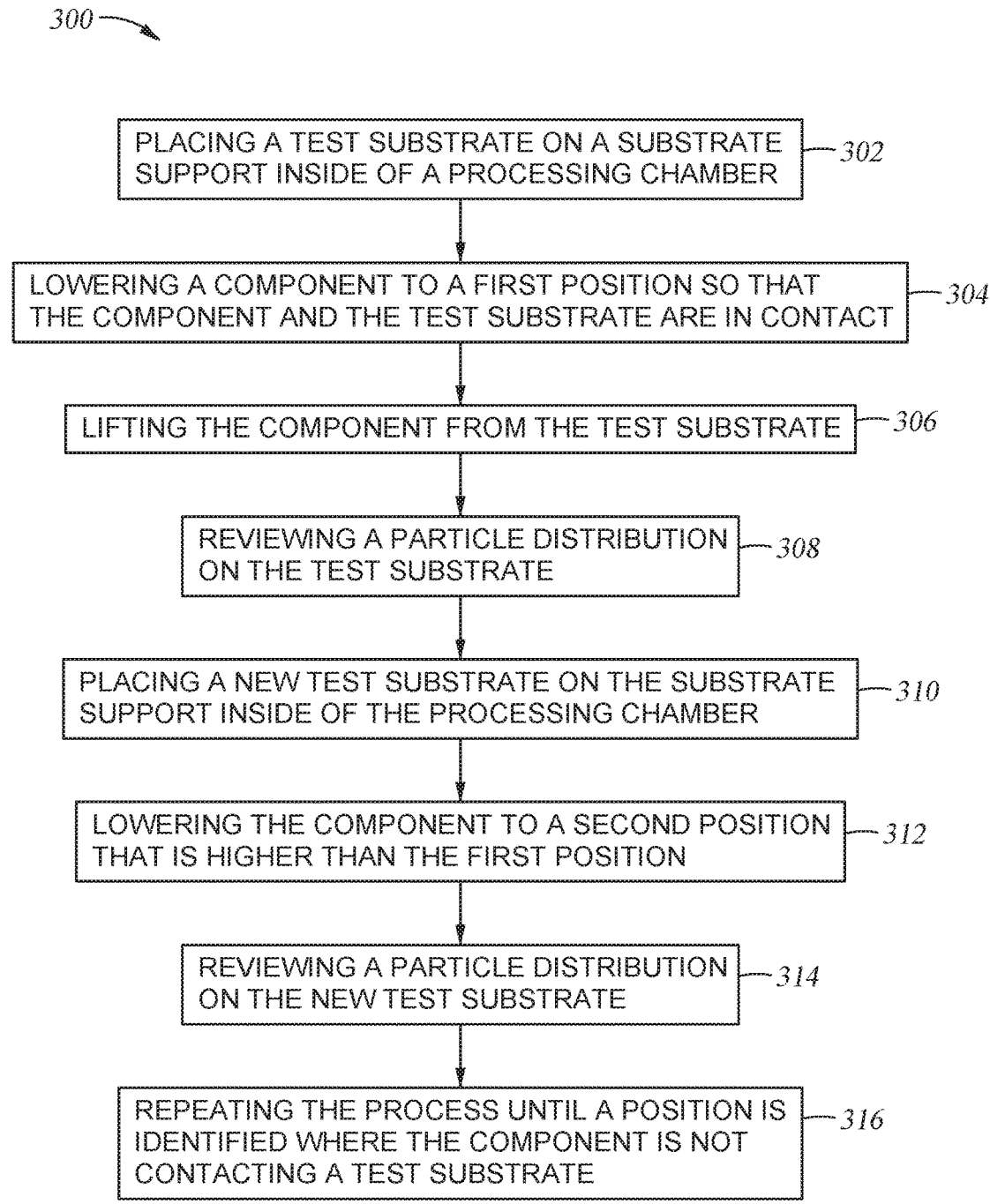
FIG. 3 illustrates operations of a method according to one implementation disclosed herein.

FIG. 3 illustrates operations of a method 300 according to one implementation disclosed herein. At block 302, a test substrate is placed on a substrate support inside of a processing chamber, and a component is located above the test substrate inside of the processing chamber. The test substrate may be the same as the test substrate 202, the substrate support may be the same as the substrate support 204, and the component may be the same as the component 206 shown in FIG. 2A.

At block 304, the component is lowered to a first position so the component and the test substrate are in contact. In one implementation, the contact is determined by the friction or resistance sensed by the motor lowering/lifting the component. However, the contact determined by the motor is not accurate enough to form a gap of less than 100 mil between the component and the test substrate by lifting the component from the test substrate. At block 306, the component is lifted from the test substrate. The test substrate may be removed from the processing chamber and may be placed into a metrology tool. The particle distribution on the surface of the test substrate 202 is reviewed, as shown at block 308. The particle distribution may be obtained from the metrology tool. If the particle distribution shows that the component is tilted, operations shown in FIG. 1 may be performed to level the component with respect to the test substrate. If the component is level with respect to the test substrate, the particle distribution should show a shape matching the surface profile of the component and the particles are substantially uniformly distributed within the shape.

Next, a new test substrate is placed onto the substrate support inside of the processing chamber, as shown at block 310. The component is lowered to a second position that is higher than the first position, as shown at block 312. In one implementation, the second position is about 1 mil higher than the first position. The accuracy of controlling the gap between the component and the test substrate is determined by the difference between the first position and the second position. At block 314, the particle distribution on the new test substrate is reviewed to determine whether the component and the new test substrate are in contact. If the test substrate shows few particles on the surface of the substrate, then the component and the new test substrate are not in contact, and the gap between the component and the test substrate can be controlled with an accuracy of about 1 mil. On the other hand, if the test substrate shows a substantial amount of particles on the surface of the substrate, then the component and the new test substrate are still in contact. If the component and the new test substrate are still in contact based on the particle distribution, operations described at blocks 310, 312 and 314 may be repeated until a position is identified where the component is not contacting a test substrate, as shown at block 316. When repeating operations described at block 312, the new position is higher than the previous position. The gap between the component and the test substrate can be controlled with an accuracy of about 1 mil.

By using one or more test substrates, leveling a component and controlling a gap between the component and a substrate can be performed with high accuracy, such as within 1 mil, for processes in which the gap between the component and the substrate is less than 100 mil, such as between 5 mil and 20 mil.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
    placing a test substrate onto a substrate support inside of a processing chamber, wherein a component is located above the test substrate;
    lowering the component to a first position so that the component and the test substrate are in contact;
    lifting the component from the test substrate;
    reviewing a first particle distribution on the test substrate; and
    adjusting the component.

2. The method of claim 1, further comprising placing a new test substrate onto the substrate support inside of the processing chamber after adjusting the component.

3. The method of claim 2, further comprising lowering the component to a second position so that the component and the new test substrate are in contact.

4. The method of claim 3, further comprising reviewing a second particle distribution on the new test substrate.

5. The method of claim 1, wherein the component is a mask.

6. The method of claim 1, wherein adjusting the component comprises turning one or more screws.

7. A method, comprising:
    placing a test substrate onto a substrate support inside of a processing chamber, wherein a mask is located above the test substrate;
    lowering the mask to a first position so that the mask and the test substrate are in contact;
    lifting the mask from the test substrate;
    reviewing a first particle distribution on the test substrate;
    adjusting the mask;
    placing a new test substrate onto the substrate support inside of the processing chamber;
    lowering the mask to a second position so that the mask and the new test substrate are in contact; and
    reviewing a second particle distribution on the new test substrate.

8. The method of claim 7, wherein adjusting the mask comprises turning one or more screws.

9. The method of claim 7, wherein the mask comprises an annular protrusion extending toward the test substrate.

10. The method of claim 7, further comprising determining the mask and the test substrate are in contact by friction or resistance sensed with a motor used for lowering and lifting the mask.

11. The method of claim 7, further comprising adjusting the mask after reviewing the second particle distribution on the new test substrate.

12. The method of claim 11, further comprising:
    placing a second new test substrate onto the substrate support inside of the processing chamber;
    lowering the mask to a third position so that the mask and the second new test substrate are in contact;
    reviewing a third particle distribution on the second new test substrate; and
    adjusting the mask after reviewing the third particle distribution on the second new test substrate.

13. A method, comprising:
    placing a test substrate onto a substrate support inside of a processing chamber, wherein a component is located above the test substrate;
    lowering the component to a first position so that the component and the test substrate are in contact;
    lifting the component from the test substrate;
    reviewing a first particle distribution on the test substrate;
    placing a first new test substrate onto the substrate support inside of the processing chamber;
    lowering the component to a second position that is higher than the first position; and
    reviewing a second particle distribution on the first new test substrate.

14. The method of claim 13, wherein the second position is higher than the first position by 1 mil.

15. The method of claim 13, further comprising placing a second new substrate onto the substrate support inside of the processing chamber.

16. The method of claim 15, further comprising lowering the component to a third position that is higher than the second position, and reviewing a third particle distribution on the second new test substrate.

17. The method of claim 13, wherein the component is a mask.

18. The method of claim 17, wherein the mask comprises an annular protrusion extending toward the test substrate.

19. The method of claim 13, further comprising leveling the component with respect to the test substrate after reviewing the first particle distribution on the test substrate and prior to placing the first new test substrate onto the substrate support inside of the processing chamber.

20. The method of claim 19, wherein the component is a mask.

* * * * *